US012676194B2

(12) United States Patent
Smith et al.

(10) Patent No.: US 12,676,194 B2
(45) Date of Patent: Jul. 7, 2026

(54) INTERFACES BETWEEN HIGHER VOLTAGE AND LOWER VOLTAGE WAFERS AND RELATED APPARATUSES AND METHODS

(71) Applicant: Micron Technology, Inc., Boise, ID (US)

(72) Inventors: Michael A. Smith, Boise, ID (US); Kunal R. Parekh, Boise, ID (US); Hernan A. Castro, Shingle Springs, CA (US)

(73) Assignee: Micron Technology, Inc., Boise, ID (US)

( * ) Notice: Subject to any disclaimer, the term of this patent is extended or adjusted under 35 U.S.C. 154(b) by 162 days.

(21) Appl. No.: 18/315,311

(22) Filed: May 10, 2023

(65) Prior Publication Data

US 2023/0395159 A1     Dec. 7, 2023

Related U.S. Application Data

(60) Provisional application No. 63/365,773, filed on Jun. 2, 2022.

(51) Int. Cl.
| | |
|---|---|
| *G11C 16/24* | (2006.01) |
| *G11C 16/16* | (2006.01) |
| *H10B 43/10* | (2023.01) |
| *H10B 43/40* | (2023.01) |
| *G11C 16/04* | (2006.01) |
| *H10B 80/00* | (2023.01) |

(52) U.S. Cl.
CPC .............. *G11C 16/24* (2013.01); *G11C 16/16* (2013.01); *H10B 43/10* (2023.02); *H10B 43/40* (2023.02); *G11C 16/0483* (2013.01); *H10B 80/00* (2023.02)

(58) Field of Classification Search
CPC ........ G11C 16/24; G11C 16/16; H10B 43/40; H10B 43/10
USPC ...................................................... 365/185.12
See application file for complete search history.

(56) References Cited

U.S. PATENT DOCUMENTS

| | | | | |
|---|---|---|---|---|
| 9,070,461 B2 * | 6/2015 | Kim | ........................ | G11C 16/26 |
| 10,885,984 B1 * | 1/2021 | Yabe | ................... | G11C 16/0483 |
| 11,081,190 B1 * | 8/2021 | Anand | ............... | G11C 16/0483 |

(Continued)

*Primary Examiner* — Alexander Sofocleous
*Assistant Examiner* — Duy H Luong
(74) *Attorney, Agent, or Firm* — TraskBritt

(57) ABSTRACT

Interfaces between higher voltage and lower voltage wafers and related apparatuses and methods are disclosed. An apparatus includes a memory wafer and a logic wafer. Data storage elements of an array are configured to perform an operation responsive to an operational voltage potential. The memory wafer also includes bitlines electrically connected to the data storage elements and isolation devices electrically connected to the bitlines. The logic wafer is bonded to the memory wafer. The logic wafer includes logic circuitry electrically connected to the bitlines through the isolation devices. A maximum voltage potential difference tolerance of the logic circuitry is less than an operational voltage potential difference between the operational voltage potential and a reference voltage potential of the logic circuitry. A method includes isolating the logic circuitry from the bitlines, applying the operational voltage potential to the data storage elements, and electrically connecting the logic circuitry to the bitlines.

20 Claims, 9 Drawing Sheets

(56)          References Cited

U.S. PATENT DOCUMENTS

| 2017/0309339 | A1* | 10/2017 | Hsiung | .............. | G11C 16/0466 |
| 2021/0057360 | A1* | 2/2021 | Oh | .......................... | G11C 5/025 |
| 2021/0217478 | A1* | 7/2021 | Oh | .......................... | H01L 25/18 |
| 2022/0020435 | A1* | 1/2022 | Moschiano | .............. | G11C 7/12 |
| 2022/0139895 | A1* | 5/2022 | Choi | ...................... | G11C 16/24 |
| | | | | | 365/185.13 |
| 2022/0149199 | A1* | 5/2022 | Smith | .................. | H10D 62/235 |
| 2023/0162791 | A1* | 5/2023 | Jeon | ................... | G11C 16/0433 |
| | | | | | 365/185.05 |

* cited by examiner

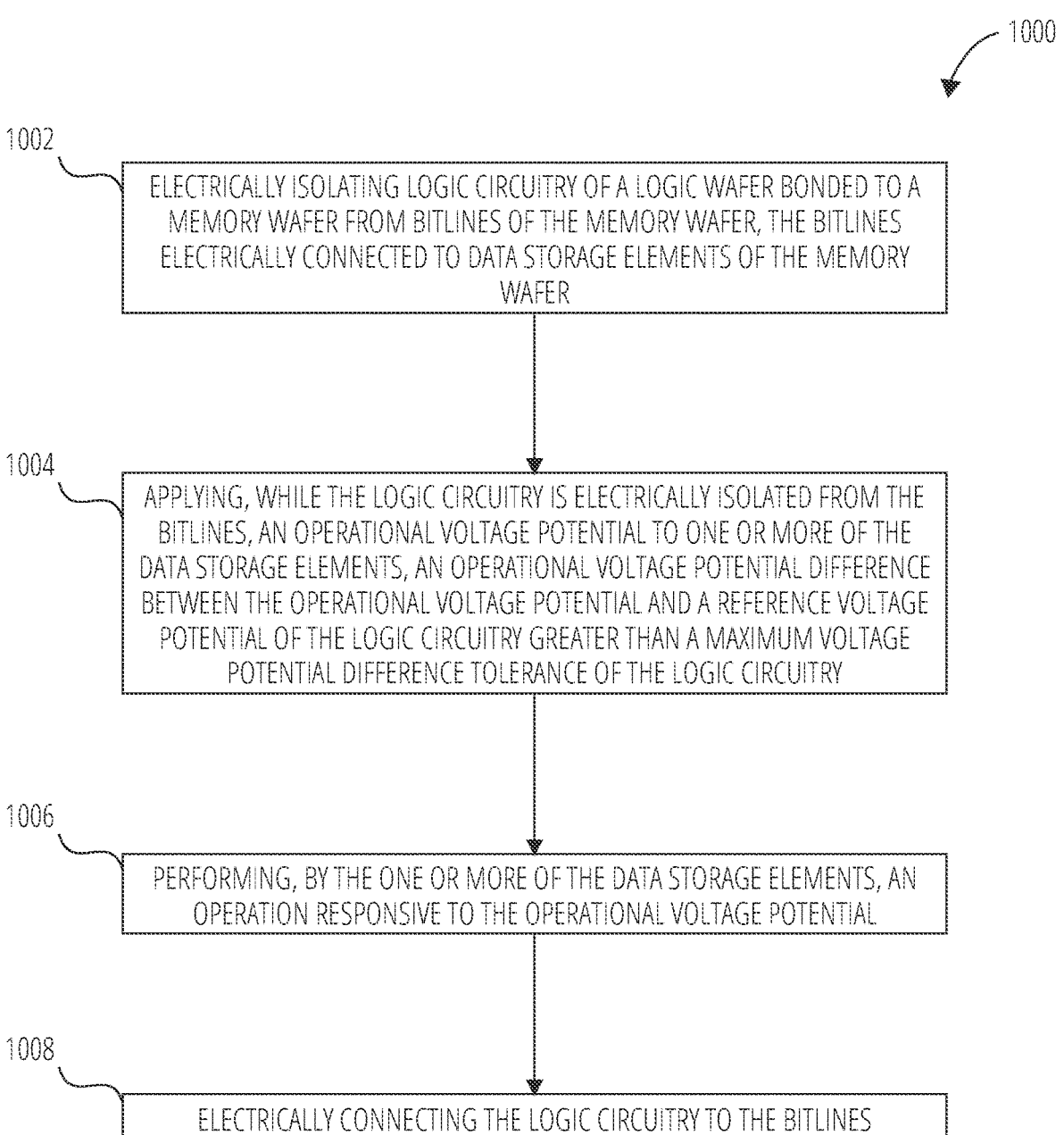

1000

1002
ELECTRICALLY ISOLATING LOGIC CIRCUITRY OF A LOGIC WAFER BONDED TO A MEMORY WAFER FROM BITLINES OF THE MEMORY WAFER, THE BITLINES ELECTRICALLY CONNECTED TO DATA STORAGE ELEMENTS OF THE MEMORY WAFER

1004
APPLYING, WHILE THE LOGIC CIRCUITRY IS ELECTRICALLY ISOLATED FROM THE BITLINES, AN OPERATIONAL VOLTAGE POTENTIAL TO ONE OR MORE OF THE DATA STORAGE ELEMENTS, AN OPERATIONAL VOLTAGE POTENTIAL DIFFERENCE BETWEEN THE OPERATIONAL VOLTAGE POTENTIAL AND A REFERENCE VOLTAGE POTENTIAL OF THE LOGIC CIRCUITRY GREATER THAN A MAXIMUM VOLTAGE POTENTIAL DIFFERENCE TOLERANCE OF THE LOGIC CIRCUITRY

1006
PERFORMING, BY THE ONE OR MORE OF THE DATA STORAGE ELEMENTS, AN OPERATION RESPONSIVE TO THE OPERATIONAL VOLTAGE POTENTIAL

1008
ELECTRICALLY CONNECTING THE LOGIC CIRCUITRY TO THE BITLINES

FIG. 10

INTERFACES BETWEEN HIGHER VOLTAGE AND LOWER VOLTAGE WAFERS AND RELATED APPARATUSES AND METHODS

CROSS-REFERENCE TO RELATED APPLICATION

This application claims the benefit under 35 U.S.C. § 119(e) of U.S. Provisional Patent Application Ser. No. 63/365,773, filed Jun. 2, 2022, the disclosure of which is hereby incorporated herein in its entirety by this reference.

TECHNICAL FIELD

This disclosure relates generally to interfaces between higher voltage and lower voltage wafers, and more specifically to isolation transistors to interface a higher voltage memory wafer (e.g., a NAND memory wafer) with a lower voltage logic wafer.

BACKGROUND

Electrical circuitry that is tolerant to relatively high voltage potential differences may be manufactured in specific ways in order to tolerate the relatively high voltage potential differences. For example, conductive traces and semiconductor devices that will be exposed to relatively higher voltage potential differences may be manufactured to have larger dimensions than conductive traces and semiconductor devices that will be exposed to relatively lower voltage potential differences. As a result, accommodating relatively higher voltage potentials may generally come at the penalty of occupation of relatively greater amounts of semiconductor wafer area, or "real estate."

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

FIG. 10 is a flowchart illustrating a method of operating a memory device, according to some embodiments;

DETAILED DESCRIPTION

Figure 1:
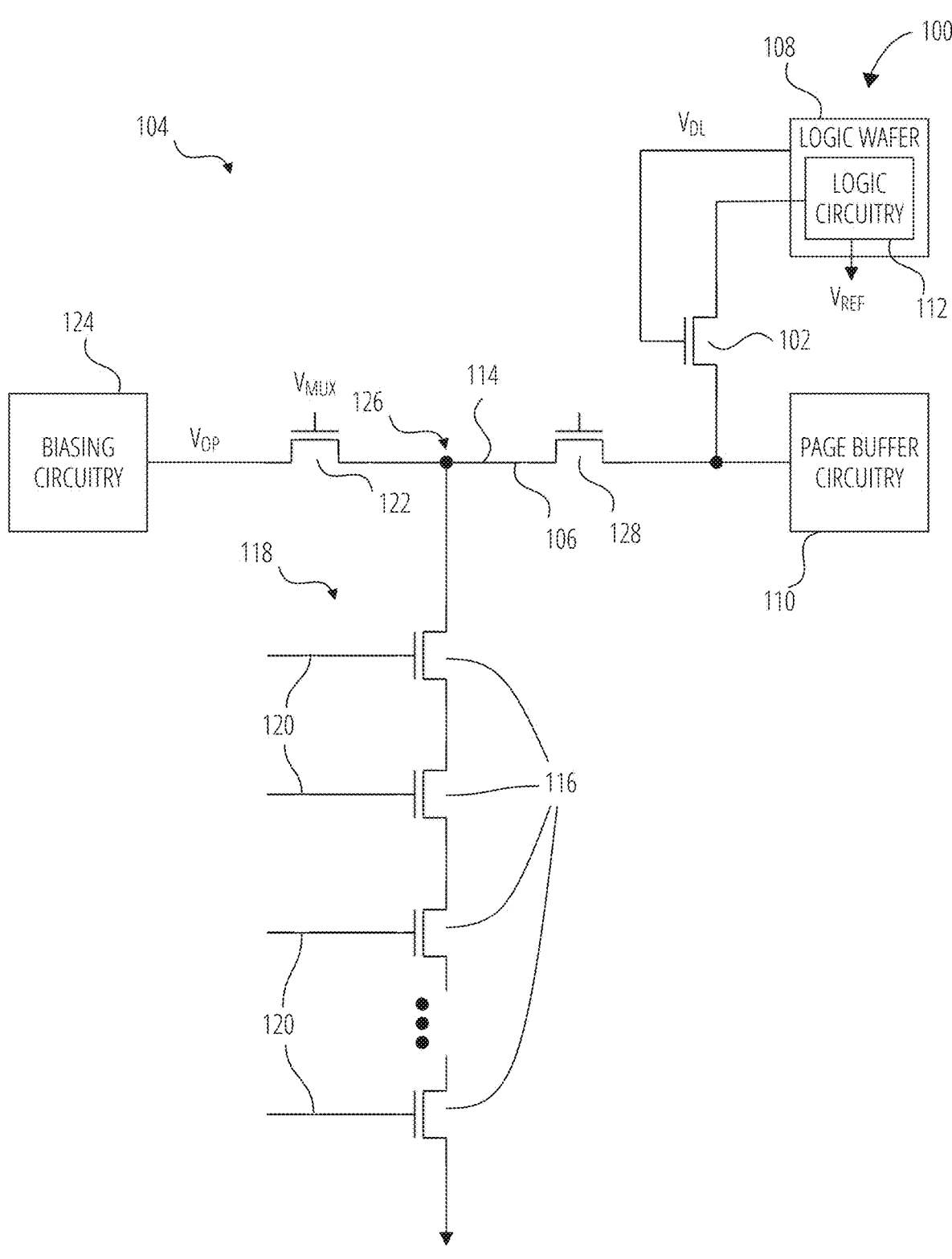
FIG. 1 is an electrical circuit schematic illustration of an apparatus, according to some embodiments.

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments enabled herein may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. In some instances similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawings could be arranged and designed in a wide variety of different configurations. Thus, the following description of various embodiments is not intended to limit the scope of the present disclosure, but is merely representative of various embodiments. While the various aspects of the embodiments may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art will understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may include one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the terms "conductive material" mean and include electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, the terms "insulative material" mean and include electrically insulative material, such as one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$), at least one dielectric nitride material (e.g., a silicon nitride ($SiN_y$)), at least one dielectric oxynitride material (e.g., a silicon oxynitride ($SiO_xN_y$)), at least one dielectric oxycarbide material (e.g., silicon oxycarbide ($SiO_xC_y$)), at least one hydrogenated dielectric oxycarbide material (e.g., hydrogenated silicon oxycarbide ($SiC_xO_yH_z$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_y$, $SiC_xO_yH_z$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "semiconductor material" refers to a material having an electrical conductivity between those of electrically insulating materials and electrically conductive materials. For example, a semiconductor material may have an electrical conductivity of between about $10^{-8}$ Siemens per centimeter (S/cm) and about $10^4$ S/cm ($10^6$ S/m) at room temperature. Examples of semiconductor materials include elements found in column IV of the periodic table of elements such as silicon (Si), germanium (Ge), and carbon (C). Other examples of semiconductor materials include compound semiconductor materials such as binary compound semiconductor materials (e.g., gallium arsenide (GaAs)), ternary compound semiconductor materials (e.g., $Al_xGa_{1-x}As$), and quaternary compound semiconductor materials (e.g., $Ga_xIn_{1-x}As_yP_{1-y}$), without limitation. Compound semiconductor materials may include combinations of elements from columns III and V of the periodic table of elements (III-V semiconductor materials) or from columns II and VI of the periodic table of elements (II-VI semiconductor materials), without limitation. Semiconductor devices often include crystalline semiconductor materials. By way of non-limiting examples, transistors and diodes include crystalline semiconductor materials.

As used herein, the term "intrinsic semiconductor material" refers to a semiconductor material having a relatively small density of impurities (e.g., a lower density of impurities than electron and hole densities resulting from thermal generation at room temperature).

As used herein, the term "doped semiconductor material" refers to a semiconductor material having a higher density of impurities introduced thereto than intrinsic semiconductor materials (e.g., a higher density of impurities than electron and hole densities resulting from thermal generation at room temperature). A doped semiconductor material may be doped predominantly with donor impurities such as phosphorus (P), antimony (Sb), bismuth (Bi), and arsenic (As), without limitation. Each donor impurity in a crystal lattice of semiconductor material adds a free electron, which increases the conductivity of the semiconductor material relative to the intrinsic form of the semiconductor material. Doped semiconductor materials that have been doped predominantly with donor impurities are referred to herein as "N-type semiconductor materials." A doped semiconductor may instead be doped predominantly with trivalent or acceptor impurities such as boron (B), indium (In), aluminum (Al), and gallium (Ga), without limitation. Each trivalent or acceptor impurity in a crystal lattice of semiconductor material adds an electron hole (referred to herein as "hole"), which increases the conductivity of the semiconductor material relative to the intrinsic form of the semiconductor material. Doped semiconductor materials that have been doped predominantly with trivalent or acceptor impurities are referred to herein as "P-type semiconductor materials."

As used herein, the term "active material" refers to a semiconductor material that has been doped to function as a channel material in a metal oxide semiconductor (MOS) field effect transistor (FET) (MOSFET). A MOSFET transistor having a channel material that has been doped predominantly with donor impurities is referred to herein as an N-type MOS (NMOS) transistor because the active material serving as the channel material for the NMOS transistor includes N-type semiconductor material. Similarly, a MOSFET transistor having a channel material that has been doped predominantly with trivalent or acceptor impurities is referred to herein as a P-type MOS (PMOS) transistor because the active material serving as the channel material for the PMOS transistor includes P-type semiconductor material.

As used herein, the terms "source/drain terminal," refer to source and drain terminals of a MOSFET transistor. As will be appreciated by those of ordinary skill in the art, a MOSFET transistor may be substantially symmetrical, and often the source terminal may be indistinguishable from the drain terminal until the MOSFET is electrically connected to electrical circuitry in a particular orientation. Since a MOSFET includes a source terminal and a drain terminal, these terminals may be referred to more generically as source/drain terminals, or a first source/drain terminal and a second source/drain terminal.

As used herein, the term "assert," when used in conjunction with a gate terminal of an isolation device or transistor, refers to application of a voltage potential at the gate terminal to cause the isolation device or transistor to electrically conduct. Where the isolation device or transistor is used as a switch, an "assertion" of or "asserting" the gate terminal refers to applying a voltage potential to the gate terminal to turn on, or equivalently close, the switch. By way of non-limiting example, asserting a gate terminal of an NMOS transistor may include biasing the gate terminal to a logic level high voltage potential to attract electrons of an active material of the NMOS transistor toward the gate material, forming a conductive channel between source/drain terminals of the NMOS transistor through the active material. Also by way of non-limiting example, asserting a gate terminal of a PMOS transistor may include biasing the gate terminal to a logic level low voltage potential to attract electron holes of an active material of the PMOS transistor toward the gate material, forming a conductive channel between source/drain terminals of the PMOS transistor.

As used herein, the term "de-assert," when used in conjunction with a gate terminal of an isolation device or transistor, refers to application of a voltage potential at the gate terminal to prevent the isolation device or transistor from electrically conducting. Where the isolation device or transistor is used as a switch, a "de-assertion" of or "de-asserting" the gate terminal refers to applying a voltage potential to the gate terminal to turn off, or equivalently open, the switch. By way of non-limiting example, de-asserting a gate terminal of an N-type MOSFET may include biasing the gate terminal to a logic level low voltage potential to repel electrons of an active material of the N-type MOSFET away from the gate material, depleting the active material of electrons and electrically isolating source/drain terminals of the N-type MOSFET from each other. Also by way of non-limiting example, de-asserting a gate terminal of a P-type MOSFET may include biasing the gate terminal to a logic level high voltage potential to repel electron holes of an active material of the P-type MOSFET way from the gate material, depleting the active material of electron holes and electrically isolating source/drain terminals of the P-type MOSFET from each other.

As used herein, the term "high voltage," when used to describe an electrical circuit, an electrical device, or a semiconductor wafer including one or more electronic devices, indicates that one or more voltage potential differences that the electrical circuit, electrical device, or semiconductor wafer is manufactured to tolerate are higher than relatively lower voltage potentials that another electrical circuit, electrical device, or semiconductor wafer is manufactured to tolerate. Also, as used herein, the term "low voltage," when used to describe an electrical circuit, an electrical device, or a semiconductor wafer including one or more electronic devices, indicates that the electrical circuit, the electrical device, or the semiconductor wafer is not manufactured to tolerate relatively high voltage potential differences that a "high voltage" electrical circuit, electrical device, or semiconductor wafer including one or more electronic devices is manufactured to tolerate.

As used herein, the terms "electrically connect" and "electrically connected" refer to both direct and indirect electrical connections.

As used herein, the term "flip-chip" refers to a multi-wafer structure in which a first wafer and a second wafer are bonded together. By way of non-limiting example, interfacing structures (e.g., electrical contacts) may be manufactured on a first side of each of the first wafer and the second wafer. The second wafer may be "flipped," or equivalently oriented such that the first side of the second wafer is facing the first side of the first wafer, and the second wafer may be bonded to the first wafer. In this way, the electrical contacts of the first wafer may electrically connect to the electrical contacts of the second wafer, and the first wafer and the second wafer may electrically interact with each other through the electrical contacts.

Some electronic devices may include some circuitry that is manufactured to tolerate relatively higher voltage potential differences (e.g., "high voltage circuitry") than other circuitry that will be exposed to relatively lower voltage potential differences (e.g., "low voltage circuitry"). One non-limiting example of an electronic device that includes high voltage circuitry and low voltage circuitry is a Flash memory device, such as a NAND memory device. In flash memory devices (e.g., NAND memory devices), relatively large voltage potential differences may be applied to data storage elements and electrical circuitry electrically connected to the data storage elements during erase operations. Accordingly, dimensions of devices and traces that are electrically connected directly to the data storage elements may be relatively large to enable the devices and traces to tolerate these relatively higher voltage potential differences.

The use of relatively large device dimensions in these high voltage electronic devices may result in a larger occupation of chip area than would be occupied by relatively smaller, equivalent devices that would be possible in low voltage electronic devices. Logic circuitry manufactured at the same dimensions as high voltage electronic devices may also occupy a large amount of chip area, and may further consume more power, operate more slowly, generate more heat, and have larger parasitic capacitances than electronic devices manufactured according to smaller dimensions of low voltage electronic devices.

In the case of Flash memory devices, periods of time where an erase voltage potential is applied to storage elements may be relatively small compared to total operational times. As a result, the use of large-dimension devices in logic circuitry of Flash memory devices may come at a relatively large penalty in occupied chip area, power, switching speed, heat, and parasitic capacitance despite the small fraction of the time that the Flash memory device is operating during an erase operation. Interfacing a low voltage logic wafer directly to a Flash (e.g., NAND) array of a memory wafer would, however, expose the low voltage logic wafer to high voltage potential differences during erase operations. The low voltage logic wafer should be protected from exposure to these high voltage potential differences to avoid damage to the low voltage logic wafer.

Various embodiments disclosed herein relate generally to selectively electrically isolating low voltage circuitry from high voltage circuitry during high voltage operation of the high voltage circuitry, and electrically connecting the low voltage circuitry to the high voltage circuitry during low voltage operation of the high voltage circuitry. The low voltage circuitry may safely interact with the high voltage circuitry during low voltage operation. In the non-limiting example of a Flash memory device, low voltage logic circuitry may be electrically connected to high voltage bitlines through isolation devices. The isolation devices may be activated to electrically connect the low voltage logic circuitry to the bitlines responsive to low voltage operation of the flash memory device. The isolation devices may be deactivated to electrically isolate the low voltage logic circuitry responsive to high voltage operation of the flash memory device (e.g., erase operation). Accordingly, the low voltage logic circuitry of a low voltage logic wafer may interface with an array of data storage elements of the Flash memory wafer during low voltage operation (e.g., read operations, write operations, standby operation of the Flash memory wafer), and may be electrically isolated and protected from the array during erase operations.

In various embodiments a separate low voltage logic wafer may be bonded to a high voltage memory wafer (e.g., a high voltage NAND Flash wafer). The high voltage memory wafer may include above-array conductive (e.g., metal) connectors extending from the bitlines, conductive (e.g., metal) contacts within through vias (e.g., through openings), and isolation transistors selectively electrically connecting the above-array conductive connectors to the conductive contacts. The low voltage logic wafer is electrically connected to the conductive contacts. The low voltage logic wafer is electrically connected to gates of the isolation devices to enable the low voltage logic wafer to control the isolation devices.

In some embodiments a NAND circuitry architecture interfaces with an external logic supply chip. Isolation circuitry may enable a NAND chip to interface with a bonded low voltage logic wafer to create a compute-in-memory neural network inference chip. The isolation circuitry may include wiring to bitline nodes in upper metal levels of the NAND chip, and routing to a region neighboring the array (e.g., the NAND data storage elements). This region neighboring the array may include an array of high voltage isolation transistors, which may electrically connect the bitlines to the bonded chip.

One challenge in isolating a bonded low voltage logic wafer from high voltage potential differences of a high voltage NAND chip is that placing high voltage isolation transistors on a bonded low voltage logic wafer would involve a high voltage process, which is generally not provided for by manufacturing equipment for low voltage logic wafers. High voltage isolation field effect transistors (FETs), however, may be used in NAND memory chips to protect page buffer circuitry from bitline voltage potentials. The bonded low voltage logic wafer may be electrically connected into a node on a low voltage side of these high voltage isolation FETs that protect the page buffer circuitry, but these high voltage isolation FETs may be positioned under the data storage elements of the NAND array and may be routed with local interconnect routing. Accordingly, it may be difficult to electrically connect the bonded wafer to these high voltage isolation FETs, or may involve redesigning page buffer circuitry and other portions of the NAND chip to implement.

In some embodiments the high voltage NAND chip includes routing above array metals to electrically connect the bitlines to high voltage isolation FETs, which selectably electrically connect the bitlines to the bonded low voltage logic wafer. These high voltage isolation FETs may be separate from those used to protect the page buffer circuitry, which would reduce modification to existing NAND chip design. These high voltage isolation FETs may be implemented in a newly designated silicon area (e.g., in a region lateral to the array).

In some embodiments an apparatus includes a memory wafer and a logic wafer bonded to the memory wafer. The memory wafer includes an array of data storage elements, bitlines electrically connected to the data storage elements, and isolation devices electrically connected to the bitlines. The data storage elements of the array of data storage elements are configured to perform an operation responsive to an operational voltage potential applied thereto. The logic wafer includes logic circuitry electrically connected to the bitlines through the isolation devices. A maximum voltage potential difference tolerance of the logic circuitry is less than an operational voltage potential difference between the operational voltage potential and a reference voltage potential of the logic circuitry.

In some embodiments a method of operating a memory device includes electrically isolating logic circuitry of a logic wafer bonded to a memory wafer from bitlines of the memory wafer. The bitlines are electrically connected to data storage elements of the memory wafer. The method also includes applying, while the logic circuitry is electrically isolated from the bitlines, an operational voltage potential to one or more of the data storage elements. An operational voltage potential difference between the operational voltage potential and a reference voltage potential of the logic circuitry is greater than a maximum voltage potential difference tolerance of the logic circuitry. The method further includes performing, by the one or more of the data storage elements, an operation responsive to the operational voltage potential, and electrically connecting the logic circuitry to the bitlines.

In some embodiments an apparatus includes a memory wafer, which includes NAND pillars defining data storage elements, bitlines electrically connected to the NAND pillars, an isolation device, a first conductive contact electrically connected to the isolation device, above-array conductive material electrically connecting the first conductive contact to one or more of the bitlines, and a second conductive contact electrically connected to the isolation device. The second conductive contact is configured to electrically connect to logic circuitry of a logic wafer responsive to bonding of the logic wafer to the memory wafer. The isolation device is configured to selectively electrically connect the logic circuitry to the one or more of the bitlines.

In some embodiments an apparatus includes a logic wafer, which includes logic circuitry, buffer circuitry, and gate control logic circuitry. The logic circuitry is configured to selectively electrically connect to bitlines of a memory wafer through one or more isolation devices of the memory wafer responsive to bonding of the logic wafer to the memory wafer. The gate control logic circuitry is configured to electrically connect to one or more gate terminals of the one or more isolation devices of the memory wafer responsive to the bonding of the logic wafer to the memory wafer.

FIG. 1 is an electrical circuit schematic illustration of an apparatus 100, according to some embodiments. The apparatus 100 includes a memory wafer 104 and a logic wafer 108 bonded to the memory wafer 104 (e.g., the logic wafer 108 may be a flip-chip bonded to the memory wafer 104 or the memory wafer 104 may be a flip-chip bonded to the logic wafer 108). The memory wafer 104 includes an array 118 of data storage elements 116, bitlines (e.g., bitline 114) electrically connected to the data storage elements 116, and isolation devices (e.g., isolation device 102) electrically connected to the bitlines. The data storage elements 116 of the array 118 of data storage elements 116 are configured to perform an operation responsive to an operational voltage potential $V_{OP}$ applied thereto. The logic wafer 108 includes logic circuitry 112 electrically connected to the bitlines through the isolation devices. For example, FIG. 1 illustrates the logic circuitry 112 electrically connected to the bitline 114 through the isolation device 102. A voltage potential difference tolerance of the logic circuitry 112 is less than an operational voltage potential difference between the operational voltage potential $V_{OP}$ and a reference voltage potential $V_{REF}$ (e.g., ground, a power supply low voltage potential VSS) at the logic circuitry 112.

The memory wafer 104 also includes a biasing circuitry 124, a multiplexer 122, a page buffer circuitry 110, and a page buffer isolation device 128. The biasing circuitry 124 is configured to provide operational voltage potential $V_{OP}$ to the multiplexer 122, which is configured to selectively provide the operational voltage potential $V_{OP}$ to the bitline 114 responsive to a multiplexer control voltage potential $V_{MUX}$. The multiplexer 122 may be configured to selectively operably couple the biasing circuitry 124 to any of multiple bitlines including the bitline 114, although only the bitline 114 is shown in FIG. 1.

In some embodiments the operation is an erase operation and the operational voltage potential $V_{OP}$ is an erase voltage potential. In such embodiments, responsive to the erase voltage potential, data stored by the data storage elements 116 is erased.

The isolation devices (e.g., the isolation device 102) are electrically connected to the bitlines (e.g., the bitline 114) through under array conductive material 106 and page buffer isolation devices (e.g., page buffer isolation device 128) configured to selectively isolate page buffer circuitry 110 from the bitlines. Accordingly, the isolation devices (e.g., isolation device 102) may include transistors having a voltage potential difference tolerance less than the operational voltage potential difference between the operational voltage potential $V_{OP}$ and other voltage potentials at the isolation device 102. Since transistors that tolerate lower voltage potential differences may be smaller than transistors that tolerate higher voltage potential differences, the isolation device 102 may have a smaller real estate penalty associated therewith than a high voltage isolation device. Since the isolation device 102, is electrically connected to the bitline 114 through the under array conductive material 106, however, implementation of the isolation device 102 may involve relatively substantial redesign of existing under array structure to accommodate the isolation device 102.

The isolation devices are configured to selectively electrically connect the logic wafer 108 to the bitlines responsive to one or more control signals provided by the logic wafer 108. As a specific, non-limiting example, the isolation device 102 is configured to electrically connect the logic circuitry 112 of the logic wafer 108 to the bitline 114 responsive to an assertion of a control signal $V_{DL}$ provided by the logic wafer 108 to a gate terminal of the isolation device 102. Also by way of non-limiting example, the isolation device 102 is configured to electrically isolate the logic circuitry 112 of the logic wafer 108 from the bitline 114 responsive to a de-assertion of the control signal $V_{DL}$. In some embodiments the isolation device 102 may instead be controlled responsive to a control signal provided by circuitry of the memory wafer 104 (circuitry not shown in FIG. 1) rather than by the control signal $V_{DL}$ provided by the logic wafer 108.

In some embodiments the data storage elements 116 are NAND flash memory data storage elements. In such embodiments the memory wafer 104 includes NAND pillars including a NAND pillar 126 illustrated in FIG. 1. The NAND pillar 126 includes the data storage elements 116. Access lines 120 are electrically connected to the data storage elements 116 to enable control of the data storage elements 116. A stairstep structure, such as a stair step structure 1126 illustrated in FIG. 11, may be used to provide connectivity to the access lines 120.

Figure 2:
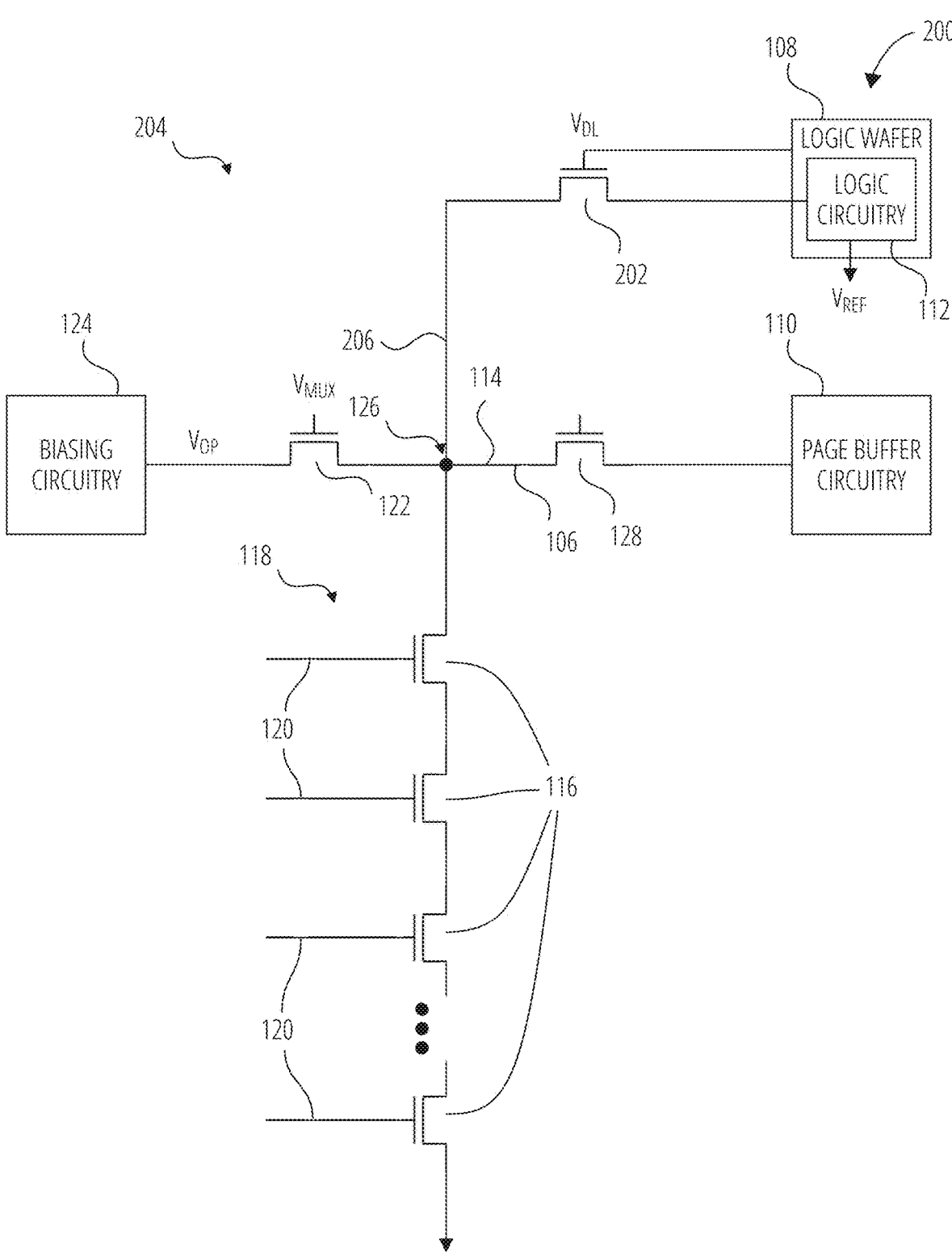
FIG. 2 is an electrical circuit schematic illustration of an apparatus, according to some embodiments.

FIG. 2 is an electrical circuit schematic illustration of an apparatus 200 according to some embodiments. The apparatus 200 is similar to the apparatus 100 of FIG. 1. For example, the apparatus 200 includes the logic wafer 108 discussed above with respect to FIG. 1. The apparatus 200 also includes a memory wafer 204, which is similar to the memory wafer 104 of FIG. 1. For example, the memory wafer 204 includes the biasing circuitry 124, the multiplexer 122, the bitline 114, the page buffer isolation device 128, the page buffer circuitry 110, the NAND pillar 126, the array 118, the data storage elements 116, and the access lines 120 discussed above with reference to the memory wafer 104 of FIG. 1.

As previously discussed, the memory wafer 104 of FIG. 1 includes an isolation device 102 that selectively electrically connects the logic circuitry 112 to the bitline 114 via the page buffer isolation device 128 and the under array conductive material 106 (FIG. 1). In contrast, the memory wafer 204 includes an isolation device 202 that electrically connects the isolation device 202 to the bitline 114 through above array conductive material 206 rather than through the page buffer isolation device 128 and the under array conductive material 106. Accordingly, the isolation device 202 is not isolated from the bitline 114 by the page buffer isolation device 128, in contrast to the isolation device 102. As a result, the isolation device 202 is exposed to the operational voltage potential $V_{OP}$ selectively provided to the bitline 114 by the logic circuitry 112. The isolation device 202, therefore, includes a transistor that has a voltage potential difference tolerance greater than or equal to an operational voltage potential difference between the operational voltage potential $V_{OP}$ and other voltage potentials at the isolation device 202.

Since the isolation device 202 is designed to tolerate the operational voltage potential difference $V_{OP}$, the isolation device 202 may be larger than the isolation device 102 of the memory wafer 104 of FIG. 1. Accordingly, the isolation device 202 may involve a larger real estate penalty than the isolation device 102 of FIG. 1. Since the isolation device 202 is electrically connected to the bitline 114 through the above array conductive material 206 rather than through the under array conductive material 106 and the page buffer isolation device 128, however, design of under array structures of previous designs may not be disrupted, which may result, in some ways, in an easier design for the memory wafer 204 than for the memory wafer 104 of FIG. 1.

In some embodiments the isolation device 202 includes a metal-oxide-semiconductor field effect transistor (MOSFET), which includes a high voltage node at a first source/drain terminal of the MOSFET, and a low voltage node at a second source/drain terminal of the MOSFET. The high voltage node is electrically connected to the bitline 114. The low voltage node is electrically connected to the logic circuitry 112. By way of non-limiting example, a first cross-sectional area of a first contact at the first source/drain terminal is larger than a second cross-sectional area of a second contact at the second source/drain terminal of the isolation device 202.

The isolation device 202 may receive the control signal $V_{DL}$ from the logic wafer 108, similar to the isolation device 102 of FIG. 1. In some embodiments, however, the isolation device 202 receives a control signal from circuitry of the memory wafer 204. In other words, the isolation device 202 may be controlled by the logic wafer 108, as illustrated in FIG. 2, or by circuitry of the memory wafer 204 (circuitry of the memory wafer 204 not shown), according to various embodiments.

Figures 3A, 3B:
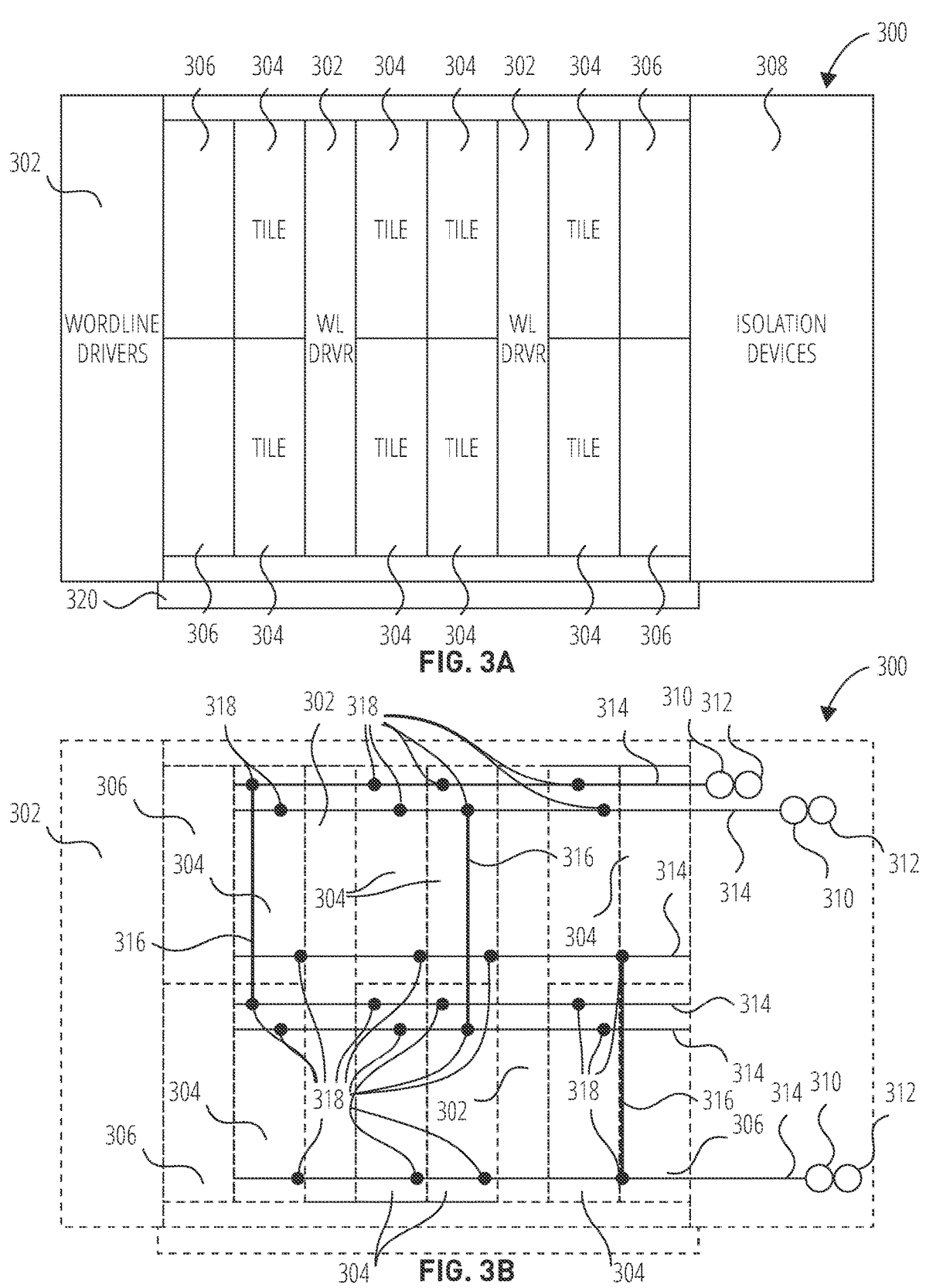
FIG. 3A is a plan view of a device layer of a memory wafer, which is an example of the memory wafer of the apparatus of FIG. 2.
FIG. 3B is a plan view of an above array conductive material layers of the memory wafer of FIG. 3A, according to some embodiments.

FIG. 3A is a plan view of a device layer of a memory wafer 300, which is an example of the memory wafer 204 of the apparatus 200 of FIG. 2. The memory wafer 300 includes active array regions 304 including tiles of an active array of data storage elements (e.g., the array 118 of data storage elements 116 of FIG. 1 and FIG. 2). Each of the active array region 304 may include pillars of data storage elements similar to the NAND pillar 126 of FIG. 1 and FIG. 2. The memory wafer 300 also includes a secondary array region 306, which may include an inactive array. The memory wafer 300 further includes wordline driver regions 302 including wordline drivers and stairstep structures for access lines (e.g., the access lines 120 of FIG. 1 and FIG. 2).

The memory wafer 300 also includes isolation device region 308, which includes multiple instances of the isolation device 202 of FIG. 2. As illustrated in FIG. 3A, in some embodiments the isolation device region 308 is laterally offset from the active array regions 304 in a device layer of the memory wafer 300. The isolation devices of the isolation device region 308 are configured to selectively electrically isolate logic circuitry (e.g., the logic circuitry 112 of FIG. 1 and FIG. 2) of a logic wafer bonded to the memory wafer 300 from bitlines electrically connected to the pillars of the active array region 304. The isolation devices of the isolation device region 308 may operate in parallel (e.g., as an array, as a tile, as a fraction of a tile).

The memory wafer 300 further includes a select gate line exit region 320. The select gate line exit region 320 may include select gate line exit and bonding connections.

FIG. 3B is a plan view of above array conductive material layers of the memory wafer 300 of FIG. 3A, according to some embodiments. The memory wafer 300 includes above array conductive materials including first above array conductive material 314 and second above array conductive material 316. The memory wafer 300 also includes conductive contact structures 318 electrically connecting the first above array conductive material 314 to the data storage elements (e.g., to the NAND pillars 126) at the active array regions 304. The memory wafer 300 further includes first conductive contacts 310 electrically connecting the first above array conductive material 314 to the isolation devices (e.g., the isolation device 102, the isolation device 202), and second conductive contacts 312 electrically connecting the isolation devices to the logic wafer (e.g., the logic wafer 108 of FIG. 1 and FIG. 2).

By way of non-limiting example, each line of the first above array conductive material 314 may electrically connect to four separate bitlines, one in each tile, via four separate conductive contact structures 318 and to one isolation device via one first conductive contact 310. In such non-limiting examples, each isolation transistor may electrically connect to four bitlines, one in each tile.

Although not shown in FIG. 3B, gate terminals of the isolation devices in the isolation device region 308 may be controlled by gate control logic of a logic wafer (e.g., a flip-chip) bonded to the memory wafer 300. In some embodiments a common electrical connection to all the gates of all the isolation devices is used to control the isolation devices. In such embodiments all the isolation devices are turned on and off at substantially the same time. In some embodiments isolation devices of a common tile or fraction of a tile are electrically controlled by a common control signal (e.g., isolation devices from separate tiles or fractions of tiles are separately controlled). In such embodiments the isolation devices within a common tile or fraction of a tile may be turned on and off at substantially the same time.

Figure 4:
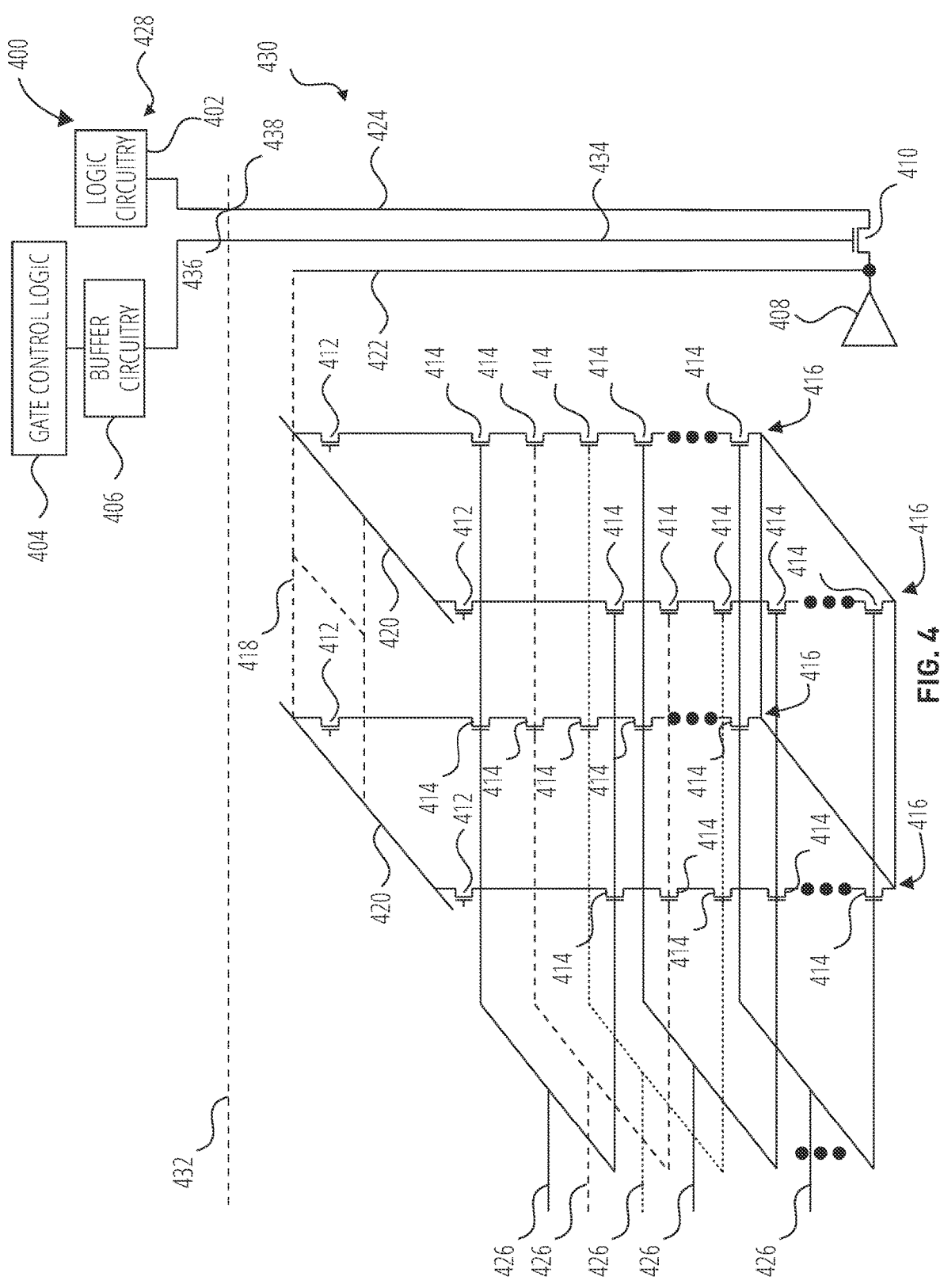
FIG. 4 is a perspective view of an apparatus, according to some embodiments.

FIG. 4 is a perspective view of an apparatus 400, according to some embodiments. The apparatus 400 is an example of the apparatus 200 of FIG. 2. The apparatus 400 includes a memory wafer 430 and a logic wafer 428 bonded to the memory wafer 430. A wafer interface 432 is illustrated in FIG. 4 to estimate physical separations that may have existed between the memory wafer 430 and the logic wafer 428 before bonding of the logic wafer 428 to the memory wafer 430. The memory wafer 430 may also be an example of the memory wafer 300 of FIG. 3A and FIG. 3B (e.g., the memory wafer 430, in some embodiments, conforms to the layouts illustrated in FIG. 3A and FIG. 3B).

The memory wafer 430 includes NAND pillars 416 defining vertically extending strings of data storage elements 414 (e.g., memory cells, such as metal-oxide-nitride-oxide-semiconductor (MONOS) memory cells), wordlines 426 (e.g., access lines), bitlines 420 (e.g., digit lines, data lines), above array conductive material 418, and biasing circuitry 408. Each NAND pillar 416 may define a series of one or more select gate transistor 412 and several data storage elements 414. The wordlines 426 electrically connected to the data storage elements 414 (e.g., to gate terminals of the data storage elements 414). The bitlines 420 are electrically connected to the NAND pillars 416. For example, each one of the bitlines 420 may be electrically connected to some of the NAND pillar 416. Interconnects (e.g., the conductive contact structures 318 of FIG. 3B) may electrically connect the bitlines 420 to the above array conductive material 418.

The memory wafer 430 also includes an isolation device 410, a first conductive contact 422 electrically connecting the above array conductive material 418 to the isolation device 410, a second conductive contact 424 electrically connecting the logic circuitry 402 to the isolation device 410, and an isolation control contact 434 electrically connecting buffer circuitry 406 of the logic wafer 428 to a gate terminal of the isolation device 410.

The logic wafer 428 is similar to the logic wafer 108 discussed above with reference to FIG. 1 and FIG. 2. For example, the logic wafer 428 includes logic circuitry 402 similar to the logic circuitry 112 of FIG. 1 and FIG. 2. A maximum voltage potential difference tolerance of the logic circuitry 402 is less than an operational voltage potential difference (e.g., an erase voltage potential difference) provided to the bitlines 420 through the first conductive contact 422 and the above array conductive material 418. The logic circuitry 402 is electrically connected to the bitlines 420 through the second conductive contact 424, the isolation device 410, the first conductive contact 422, and the above array conductive material 418. Accordingly, the logic circuitry 402 is configured to selectively electrically connect to the bitlines 420 of the memory wafer 430 through one or more isolation devices (e.g., the isolation device 410) of the memory wafer 430 responsive to the logic wafer 428 being bonded to the memory wafer 430.

The logic wafer 428 also includes gate control logic 404 and buffer circuitry 406. The gate control logic 404 is configured to electrically connect, through the buffer circuitry 406, to the isolation device 410 (e.g., to a gate terminal of the isolation device 410) of the memory wafer 430 responsive to bonding of the logic wafer 428 to the memory wafer 430. The gate control logic 404 is configured to control electrical connection of the logic circuitry 402 to the bitlines 420 by turning on and turning off the isolation device 410.

The memory wafer 430 may operate according to a low voltage operational mode and a high voltage operational mode. In the low voltage operational mode the biasing circuitry 408 provides low voltage potentials to the bitlines 420 (e.g., through the first conductive contact 422 and the above array conductive material 418) to apply low voltage potential differences across the NAND pillars 416. By way of non-limiting example, the low voltage potentials may involve read or write operations, or both, to read data from or write data to the data storage elements 414. The low voltage potentials may not be sufficient to apply, to the logic circuitry 402, voltage potential differences that are in excess of the maximum voltage potential difference tolerance.

Accordingly, during the low voltage operational mode the gate control logic 404 and the buffer circuitry 406 may control the isolation device 410 to electrically connect the logic circuitry 402 to the bitlines 420.

In the high voltage operational mode the biasing circuitry 408 provides high voltage potentials to the bitlines 420 (e.g., through the first conductive contact 422 and the above array conductive material 418) to apply high voltage potential differences across the NAND pillars 416. By way of non-limiting example, the high voltage potentials may involve an erase operation of the data storage elements 414. The high voltage potentials may be sufficient to apply, to the logic circuitry 402, voltage potential differences that are in excess of the maximum voltage potential difference tolerance. Accordingly, during the high voltage operational mode the gate control logic 404 and the buffer circuitry 406 may control the isolation device 410 to electrically isolate the logic circuitry 402 from the bitlines 420.

Although FIG. 4 illustrates gate control logic 404 in the logic wafer 428 to control the isolation device 410, in other embodiments, circuitry of the memory wafer 430 may instead control the isolation device 410. In some embodiments circuitry of the memory wafer 430 modulates a signal provided to a gate terminal of the isolation device 410.

In some embodiments the memory wafer 430 includes an impedance conditioning circuit (not shown) electrically connected in series between the second conductive contact 424 and the logic circuitry 402. In such embodiments the impedance conditioning circuit may support impedance conditioning to analog circuits.

The apparatus 400 may be considered to include a high voltage wafer (e.g., the memory wafer 430) and a low voltage wafer (e.g., the logic wafer 428) bonded (e.g., by way of one or more of oxide-oxide bonding and metal-metal bonding) to the high voltage wafer. The high voltage wafer includes high voltage circuitry (e.g., the data storage elements 414, the biasing circuitry 408) configured to operate responsive to an operational voltage potential (e.g., to perform an erase operation responsive to an erase voltage potential), an isolation device 410 electrically connected to the high voltage circuitry, and a conductive contact structure 438 electrically connected to the high voltage circuitry through the isolation device 410. The low voltage wafer includes low voltage circuitry (e.g., the logic circuitry 402) electrically connected to the conductive contact structure 438 of the memory wafer 430 (e.g., through a conductive contact structure 436 of the logic wafer 428). A maximum voltage potential difference tolerance of the low voltage wafer is less than a high voltage potential difference between the operational voltage potential and a reference voltage potential of the low voltage wafer. By way of non-limiting example, the high voltage wafer may include a NAND memory wafer, the isolation voltage potential may be an erase voltage potential, the erase voltage potential configured to erase data stored by data storage elements 414 of the NAND memory wafer, and the low voltage wafer may be the logic wafer 428.

Figures 5, 6, 7:
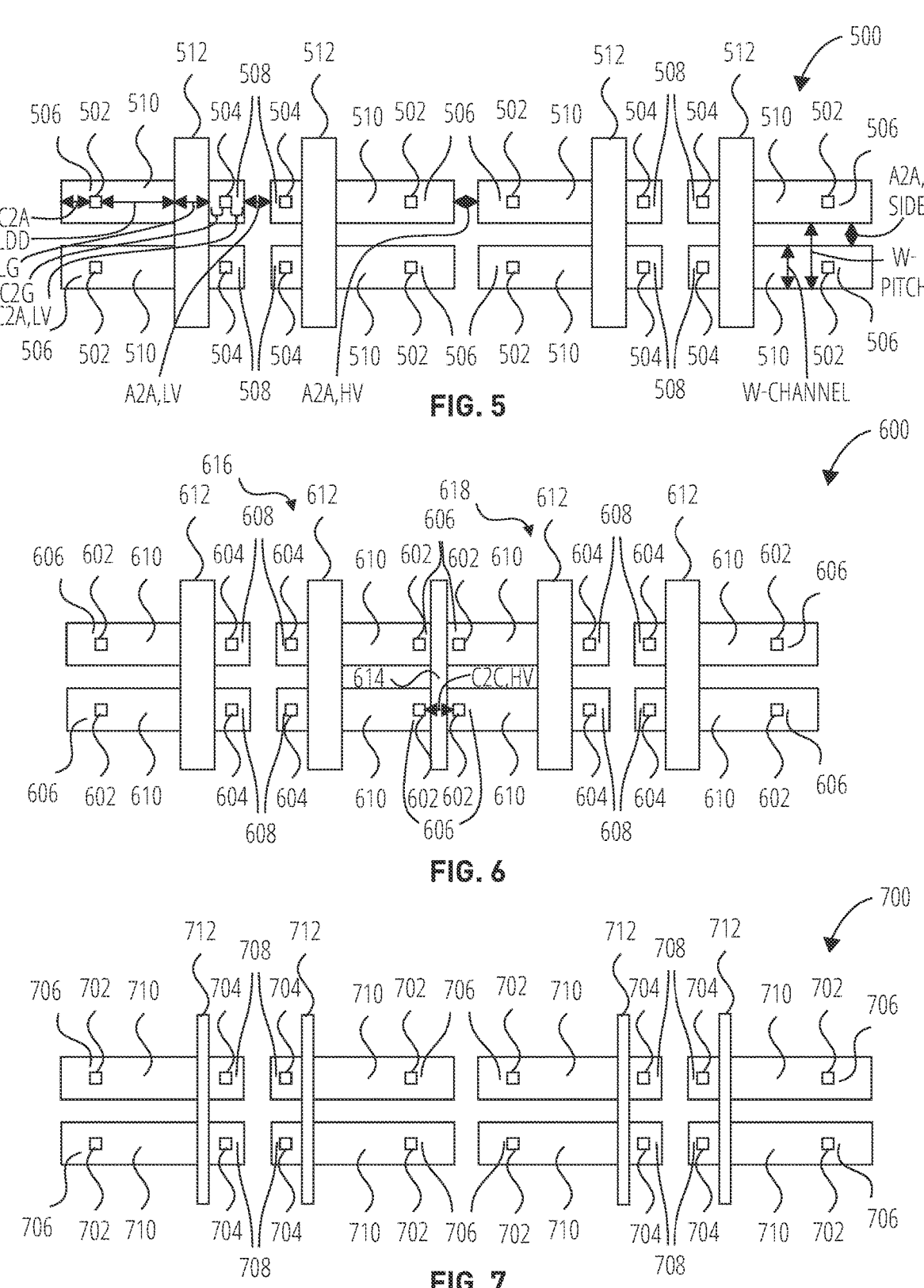
FIG. 5 is an example of a layout design for isolation devices of the apparatus of FIG. 2.
FIG. 6 is another example of a layout design for isolation devices of the apparatus of FIG. 2.
FIG. 7 is yet another example of a layout design for isolation devices of the apparatus of FIG. 2.

FIG. 5 is an example of a layout design for isolation devices 500 of the apparatus 200 of FIG. 2. The isolation devices 500 may be included by a memory wafer (e.g., the memory wafer 204 of FIG. 2, the memory wafer 300 of FIG. 3A and FIG. 3B, the memory wafer 430 of FIG. 4). The isolation devices 500 include active materials 510 overlapped by gate materials 512. Each one of the isolation devices 500 includes an active material 510 overlapped by a gate material 512. FIG. 5 illustrates eight active materials 510 and four gate materials 512, amounting to eight total isolation devices 500 (one for each active material 510).

Each of the isolation devices 500 includes a MOSFET including a high voltage node 502 at a first source/drain terminal 506 of the MOSFET. The high voltage node 502 may be a contact electrically connected to a bitline (e.g., the bitline 114 of FIG. 1 and FIG. 2, the bitlines 420 of FIG. 4). Each of the isolation devices 500 also includes a low voltage node 504 at a second source/drain terminal 508 of the MOSFET. The low voltage node 504 may be a contact electrically connected to logic circuitry of a logic wafer bonded to the memory wafer (e.g., to logic circuitry 402 of the logic wafer 428 bonded to the memory wafer 430 of FIG. 4). The gate material 512 of each of the isolation devices 500 is closer to the low voltage node 504 than to the high voltage node 502.

The isolation devices 500 are arranged to position high voltage nodes 502 proximate to other high voltage nodes 502. For example, from left to right in FIG. 5 the isolation devices 500 include a first isolation device with the high voltage node 502 on the left and the low voltage node 504 on the right, then a second isolation device with the low voltage node 504 on the left next to the low voltage node 504 of the first isolation device and the high voltage node 502 on the right. The third isolation device from the left includes the high voltage node 502 on the left next to the high voltage node 502 of the second isolation device from the left and the low voltage node 504 on the right. The fourth isolation device from the left includes the low voltage node 504 on the left next to the low voltage node 504 of the third isolation device from the left and the high voltage node 502 on the right. This alternation of high voltage nodes 502 and low voltage nodes 504 from left to right allows a reduced shallow trench isolation (STI) gap between the active materials 510 at the low voltage nodes 504 than is required between the active materials 510 at the high voltage nodes 502. For example, an active to active STI gap at the low voltage nodes 504 may be substantially 110 nm (e.g., assuming substantially 2.5 volts at the low voltage nodes 504), whereas an active to active STI gap at the high voltage nodes 502 may be about 500 nm (e.g., assuming 25 volts at the high voltage nodes 502).

The low voltage node 504 at the first source/drain terminal 506 is electrically connected to the low voltage logic circuitry and the high voltage node 502 at the low voltage node 504 is electrically connected to the high voltage bitline. Accordingly, a first cross-sectional area of a first contact at the first source/drain terminal 506 may be larger than a second cross-sectional area of a second contact at the second source/drain terminal 508.

In some embodiments the isolation devices 500 is manufactured using a similar process as that used to manufacture the isolation device 102 of FIG. 2. By way of non-limiting example, an oxide thickness $T_{OX}$ of the isolation devices 500 may be substantially between 350 and 500 angstroms. The high voltage side (e.g., the high voltage node 502), which is electrically connected to the array (e.g., via above-array metal connections), may use large contact rules according to standards of high voltage transistors to enable high break-down voltage potentials. The low voltage side of the isolation devices 500 (e.g., the low voltage node 504), which is electrically connected to the logic circuitry (e.g., through a metal via upward to a bonded flip-chip logic wafer), may use smaller contact rules typical of low voltage transistors. Bond isolation transistors may have gate widths of substantially 16 μm and gate lengths of substantially 2 μm.

Various example dimensions of the isolation devices 500 are illustrated in FIG. 5, including a high voltage contact to edge of active material distance C2A, a high voltage contact to gate material distance LDD, a length of the gate material LG, a low voltage contact to active distance C2G, a low voltage contact to edge of active material distance C2A,LV, a low voltage active to active distance A2A,LV, a high voltage active to active distance A2A,HV, a channel width W-CHANNEL, a channel width pitch W-PITCH, and a side active to active distance A2A,SIDE. Example approximate ranges for such feature dimensions are given in Table 1, along with other dimensions not shown in FIG. 5 including a contact width CONTACTS, an active material length pitch L-PITCH, and a total area pitch AREA-PITCH of one of the isolation devices 500.

TABLE 1

| Item | Approximate Dimension Range |
| --- | --- |
| C2A | 0.2-0.4 microns (μm) |
| LDD | 0.8-1.2 μm |
| LG | 1.8-2.2 μm |
| C2G | 0.3-0.4 μm |
| C2A, LV | 0.06-0.1 μm |
| A2A, LV | 0.10-0.12 μm |
| A2A, HV | 0.45-0.65 μm |
| W-CHANNEL | 14.0-18.0 μm |
| A2A, SIDE | 0.45-0.65 μm |
| CONTACTS | 0.08-0.12 μm |
| L-PITCH | 4.00-4.50 μm |
| W-PITCH | 16.00-17.00 μm |
| AREA-PITCH | 60.0-80.0 μm² |

FIG. 6 is another example of a layout design for isolation devices 600 of the apparatus 200 of FIG. 2. Similar to the isolation devices 500, the isolation devices 600 may be included by a memory wafer (e.g., the memory wafer 204 of FIG. 2, the memory wafer 300 of FIG. 3A and FIG. 3B, the memory wafer 430 of FIG. 4). The isolation devices 600 include active materials 610, gate materials 612 overlapping the active materials 610, high voltage nodes 602 at first source/drain terminals 606, and low voltage nodes 604 at second source/drain terminals 608 similar to the active materials 510, the gate materials 512, the high voltage nodes 502 at the first source/drain terminals 506, and the low voltage nodes 504 at the second source/drain terminals 508 discussed with reference to FIG. 5.

In contrast to the isolation devices 500 of FIG. 5, however, the isolation devices 600 include an isolation gate 614 overlapping the active materials 610 at the first source/drain terminals 606 between the high voltage nodes 602. A gate oxide material having a thickness of less than 100 angstroms may be used for the isolation gate 614. Also, two of the isolation devices 600 share a continuous active material 610. For example, a first isolation device 616 and a second isolation device 618 may share one of the active materials 610 with the isolation gate 614 between the two of the isolation devices 600. The isolation gate 614 is positioned proximate to respective high voltage nodes 602 of the two of the isolation devices 616 and 618.

Spacing between high voltage nodes 602 (illustrated as C2C,HV in FIG. 6) may be reduced using the isolation gate 614. The isolation gate 614 may use a thin gate oxide (e.g., substantially 70 angstroms) and may be biased along with the gate material 612. Deep trench isolation may be used to enable high voltage potentials with small contact-to-active edge rules (e.g., C2A,LV, C2C,HV) and small active-to-active rules (e.g., A2A,LV, A2A,SIDE). Example approximate ranges for various feature dimensions of the isolation devices 600 are indicated in Table 2.

TABLE 2

| Item | Approximate Dimension Range |
|---|---|
| LDD | 0.8-1.2 μm |
| LG | 1.8-2.2 μm |
| C2G | 0.3-0.4 μm |
| C2A, LV | 0.06-0.1 μm |
| A2A, LV | 0.10-0.12 μm |
| C2C, HV | 0.45-0.65 μm |
| W-CHANNEL | 14.0-18.0 μm |
| A2A, SIDE | 0.45-0.65 μm |
| CONTACTS | 0.08-0.12 μm |
| L-PITCH | 3.82-4.00 μm |
| W-PITCH | 16.00-17.00 μm |
| AREA-PITCH | 55.5-75.5 μm² |

As is apparent from a comparison of the example values provided in Table 2 to those provided in Table 1, the active material length pitch L-PITCH of each of the isolation devices 600 of FIG. 6 may be less than that of the isolation devices 500 of FIG. 5. This may be due to the reduced spacing between high voltage node 602 C2C,HV of the isolation devices 600 as compared to that of the isolation devices 500 of FIG. 5. The channel width pitches of the isolation devices 600 and the isolation devices 500 may be substantially the same. Due to the smaller active material length pitch L-PITCH of the isolation devices 600 as compared to that of the isolation devices 500, however, the total area pitch AREA-PITCH for each of the isolation devices 600 may be smaller than that for each of the isolation devices 500 of FIG. 5. As a result, the isolation gate 614 may enable a larger number of isolation devices 600 than a number of isolation devices 500 in a given area. Also, an isolation device region (e.g., the isolation device region 308 of FIG. 3A) of a memory wafer using the layout design illustrated in FIG. 6 may be smaller than an isolation device region using the layout design illustrated in FIG. 5.

FIG. 7 is yet another example of a layout design for isolation devices 700 of the apparatus 200 of FIG. 2. Similar to the isolation devices 500 of FIG. 5, the isolation devices 700 may be included by a memory wafer, (e.g., the memory wafer 204 of FIG. 2, the memory wafer 300 of FIG. 3A and FIG. 3B, the memory wafer 430 of FIG. 4). The isolation devices 700 include active materials 710, gate materials 712 overlapping the active materials 710, high voltage nodes 702 at first source/drain terminals 706, and low voltage nodes 704 at second source/drain terminals 708 similar to the active materials 510, the gate materials 512, the high voltage nodes 502 at the first source/drain terminals 506, and the low voltage nodes 504 at the second source/drain terminals 508 discussed with reference to FIG. 5.

The gate materials 712, however, may be shorter than the gate materials 512 of FIG. 5. Although a relatively high operational voltage potential may be applied to the high voltage nodes 702 (e.g., during erase operations), this relatively high operational voltage potential may be attenuated along the relatively longer lengths of the active materials 710 from the high voltage nodes 702 to the gate materials 712. As a result, the gate materials 712 may be sized to tolerate a maximum gate voltage potential to source voltage potential difference that is less than the operational voltage potential. In other words, the gate materials 712 may be low voltage gates. Despite the relative shortness of the gate materials 712, a gate oxide associated with the gate materials 712 may not be overstressed. In other words, a length of the gate materials 712 in a direction from the high voltage nodes 702 to the low voltage nodes 704 may be less than a length of a gate length of a high voltage transistor. By way of non-limiting example, a length of the gate materials 712 may be less than about 500 nm.

Due to the reduced length of the gate materials 712 as compared to the gate materials 512 of FIG. 5 and the gate materials 612 of FIG. 6, an area of the gate materials 712 of the isolation devices 700 may be reduced as compared to an area of the gate materials 512 of the isolation devices 500 of FIG. 5 and the gate materials 612 of FIG. 6. As a result, a total area pitch AREA-PITCH of each of isolation devices 700 may be reduced as compared to a total area pitch AREA-PITCH of each of the isolation devices 500 of FIG. 5 and each of the isolation devices 600 of FIG. 6. Example approximate ranges for various feature dimensions of the isolation devices 700 are indicated in Table 3.

TABLE 3

| Item | Value |
|---|---|
| C2A | 0.2-0.4 μm |
| LDD | 0.8-1.2 μm |
| LG | 0.40-0.50 μm |
| C2G | 0.3-0.4 μm |
| C2A, LV | 0.06-0.1 μm |
| A2A, LV | 0.10-0.12 μm |
| A2A, HV | 0.45-0.65 μm |
| W-CHANNEL | 14.0-18.0 μm |
| A2A, SIDE | 0.45-0.65 μm |
| CONTACTS | 0.08-0.12 μm |
| L-PITCH | 2.40-3.00 μm |
| W-PITCH | 16.00-17.00 μm |
| AREA-PITCH | 40.00-50.00 μm² |

It is noted that the high voltage contact to gate length LDD may make up a large percent of the total length pitch L-PITCH. As a result, a resistance of the active materials 710 at the high voltage contact to gate length LDD may be relatively large. Also, reduction in the gate length LG may be small compared to the total length pitch L-PITCH.

Figures 8A, 8B, 9:
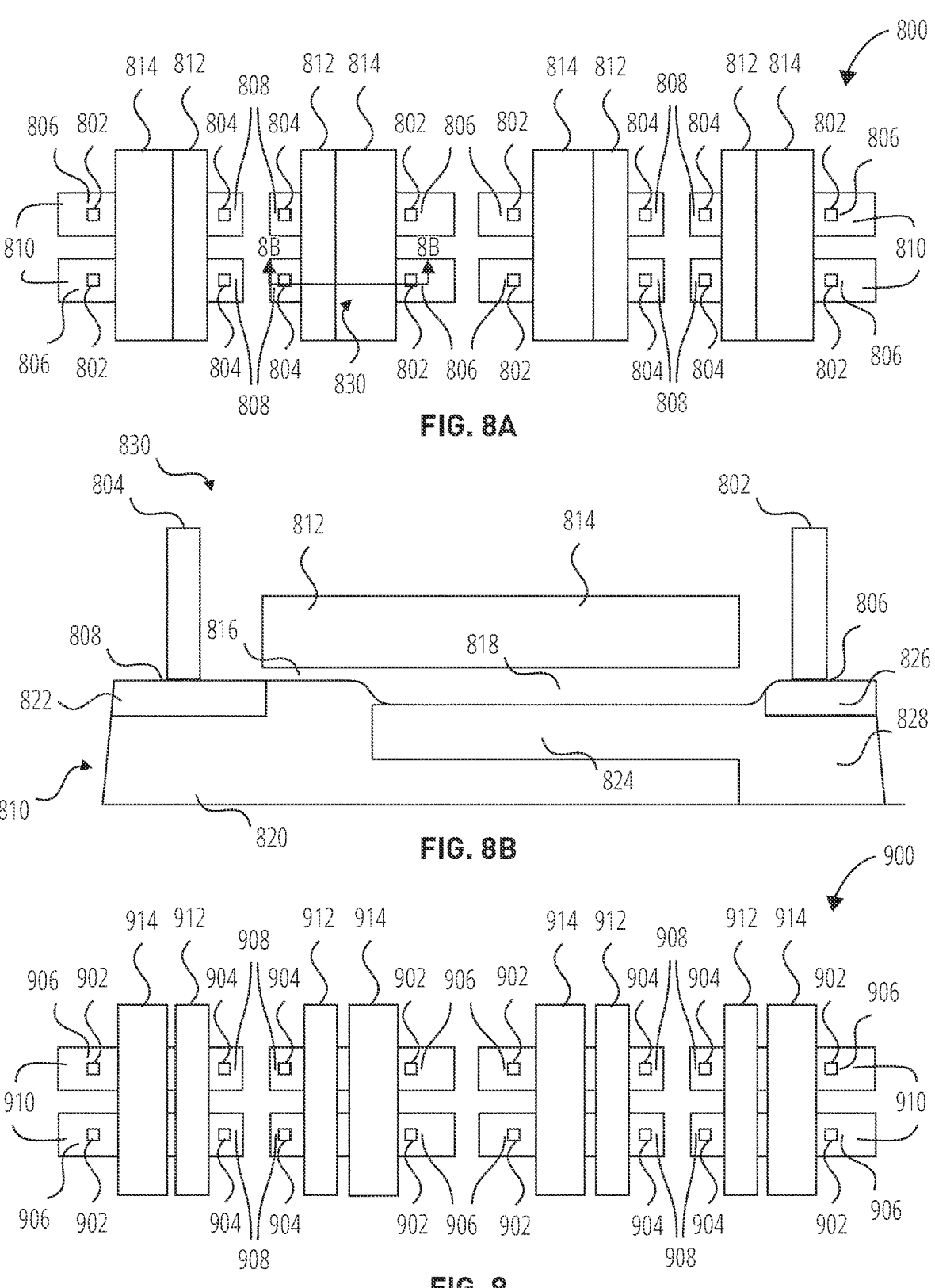
FIG. 8A is a further example of a layout design for isolation devices of the apparatus of FIG. 2.
FIG. 8B is a cross-sectional view of a MOSFET, which is one of the isolation devices of FIG. 8A, taken along line 8B of FIG. 8A.
FIG. 9 is another example of a layout design for isolation devices of the apparatus of FIG. 2.

FIG. 8A is a further example of a layout design for isolation devices 800 of the apparatus 200 of FIG. 2. Similar to the isolation devices 500 of FIG. 5, the isolation devices 800 may be included by a memory wafer, (e.g., the memory wafer 204 of FIG. 2, the memory wafer 300 of FIG. 3A and FIG. 3B, the memory wafer 430 of FIG. 4). The isolation devices 800 include active materials 810, gate materials 812 overlapping the active materials 810, high voltage nodes 802 at first source/drain terminals 806, and low voltage nodes 804 at second source/drain terminals 808 similar to the active materials 510, the gate materials 512, the high voltage nodes 502 at the first source/drain terminals 506, and the low voltage nodes 504 at the second source/drain terminals 508 discussed with reference to FIG. 5.

The isolation devices 800 also include field plates 814 between the gate materials 812 and the high voltage nodes 802 (e.g., over LDD regions of the isolation devices 800). In some embodiments the field plates 814 are extensions of the gate materials 812. The gate materials 812 and the field plates 814 may be biased during application of high voltage operational voltage potential (e.g., during an erase operation) to deplete the active materials 810 of charge carriers. This depletion of the active materials 810 may increase the resistances of the active materials 810, which may enable the use of a smaller channel width W-CHANNEL, which may depend on relative resistance of the channel itself. By way of non-limiting example, if the isolation devices 800 are NMOS transistors, a logic level low voltage potential (e.g., $V_{SS}$, ground) may be applied to the gate materials 812 and the field plates 814. During applications of lower voltage potentials to the isolation devices 800 the gate materials 812 and the field plates 814 may be biased with relatively higher magnitude voltage potentials (but within a low voltage range), which may not result in a depleting effect on the active materials 810.

FIG. 8B is a cross-sectional view of a MOSFET 830, which is one of the isolation devices 800 of FIG. 8A, taken along line 8B of FIG. 8A. The MOSFET includes an active material 810, a gate material 812 overlapping the active material 810, a high voltage node 802 at a first source/drain terminal 806, a low voltage node 804 at a second source/drain terminal 808, and a field plate 814 between the gate material 812 and the high voltage node. As illustrated in FIG. 8B, the field plate 814 is an extension from the gate material 812, and may include the same conductive material as the gate material 812. The MOSFET 830 also includes a low voltage Pwell implant 820, a gated LDD N implant 824, an N− implant 828, a N+ implant 822 at the second source/drain terminal 808, and a N+ implant 826 at the first source/drain terminal 806.

The MOSFET 830 also includes a gate oxide material 816 between the gate material 812 and the active material 810. The MOSFET 830 further includes a field plate oxide material 818 between the field plate 814 and the active material 810. The field plate oxide material 818 may be a thick oxide material even if the gate oxide material 816 uses a low voltage, thin oxide material. By way of non-limiting example, a thickness of the field plate oxide material 818 between the field plate 814 and the active material 810 of the MOSFET 830 may be greater than 200 angstroms (e.g., 400 angstroms). Also by way of non-limiting example, the gate oxide material 816 of the MOSFET 830 may have a thickness of less than about 100 Å (e.g., within a range of from about 50 Å to about 90 Å).

By way of non-limiting example, when the gate is turned on, substantially no depleting effect may be present and the electrical resistance of the active material 810 may be proportional to substantially 1/dose, where "dose" is a doping concentration factor. The N-implant 828 may use substantially a 5× dose, which may result in a ⅕×LDD resistance. This may allow further reduced channel widths W-CHANNEL for the isolation devices 800 as compared to the channel widths W-CHANNEL for the isolation devices 700 of FIG. 7, the isolation devices 600 of FIG. 6, and the isolation devices 500 of FIG. 5.

FIG. 9 is another example of a layout design for isolation devices of the apparatus 200 of FIG. 2. Similar to the isolation devices 500 of FIG. 5, the isolation devices 900 may be included by a memory wafer, (e.g., the memory wafer 204 of FIG. 2, the memory wafer 300 of FIG. 3A and FIG. 3B, the memory wafer 430 of FIG. 4). The isolation devices 900 include active materials 910, gate materials 912 overlapping the active materials 910, high voltage nodes 902 at first source/drain terminals 906, and low voltage nodes 904 at second source/drain terminals 908 similar to the active materials 510, the gate materials 512, the high voltage nodes 502 at the first source/drain terminals 506, and the low voltage nodes 504 at the second source/drain terminals 508 discussed with reference to FIG. 5.

Similar to the field plates 814, the isolation devices 900 include field plates 914. The field plates 914, however, are separate from the gate materials 912. Accordingly, the field plates 914 may be biased separately from the gate materials 912. Separation of the field plate 914 from the gate material

912 enables application of a Vpass voltage potential (e.g., substantially 10V) to the field plates 914, which would further reduce the resistances of the active materials 910 as compared to the resistances of the active materials 810 of FIG. 8A and FIG. 8B. As a result, smaller channel widths W-CHANNEL may be used in the isolation devices 900 than in the isolation devices 800 of FIG. 8A, and the total area pitch AREA-PITCH of the isolation devices 900 may be even smaller than the total area pitch AREA-PITCH of the isolation devices 800.

It is noted that the field plates 814 and the field plates 914 may be used in combination with the embodiments of the isolation devices illustrated in FIG. 5, FIG. 6, and FIG. 7. Also, the isolation gate 614 illustrated in FIG. 6 may be used in combination with the embodiments of isolation devices illustrated in FIG. 7, FIG. 8A and FIG. 8B, and FIG. 9. Furthermore, the shorter low voltage gate materials 712 may be used in combination with the embodiments of isolation devices illustrated in FIG. 6, FIG. 8A and FIG. 8B, and FIG. 9. In addition, the isolation gate 614 of FIG. 6 may be used in combination with the shorter low voltage gate materials 712 of FIG. 7, and either the field plates 814 of FIG. 8A and FIG. 8B or the field plates 914 of FIG. 9. The combination of the isolation gate 614 of FIG. 6 with the shorter low voltage gate materials 712 of FIG. 7 and the separated field plate 914 of FIG. 9 may result in a smaller total area pitch AREA-PITCH than other combinations of embodiments disclosed herein.

FIG. 10 is a flowchart illustrating a method 1000 of operating a memory device, according to some embodiments. At operation 1002 the method 1000 includes electrically isolating logic circuitry of a logic wafer bonded to a memory wafer from bitlines of the memory wafer. The bitlines are electrically connected to data storage elements of the memory wafer. In some embodiments electrically isolating the logic circuitry from the bitlines includes de-asserting a gate terminal of an isolation device electrically connected between one of the bitlines and the logic circuitry. In some embodiments electrically isolating the logic circuitry from the bitlines includes de-asserting a gate terminal of an isolation device and a field plate extending from a gate material of the gate terminal, the isolation device electrically connected between one of the bitlines and the logic circuitry. In some embodiments electrically isolating the logic circuitry from the bitlines includes de-asserting a gate terminal of an isolation device electrically connected between one of the bitlines and the logic circuitry, and asserting a field plate electrically isolated from the gate terminal between the gate terminal and a source/drain terminal of the isolation device.

At operation 1004 the method 1000 includes applying, while the logic circuitry is electrically isolated from the bitlines, an operational voltage potential to one or more of the data storage elements. An operational voltage potential difference between the operational voltage potential and a reference voltage potential of the logic circuitry is greater than a maximum voltage potential difference tolerance of the logic circuitry.

At operation 1006 the method 1000 includes performing, by the one or more of the data storage elements, an operation responsive to the operational voltage potential. In some embodiments performing the operation responsive to the operational voltage potential comprises performing an erase operation. At operation 1008 the method 1000 includes electrically connecting the logic circuitry to the bitlines.

Figure 11:
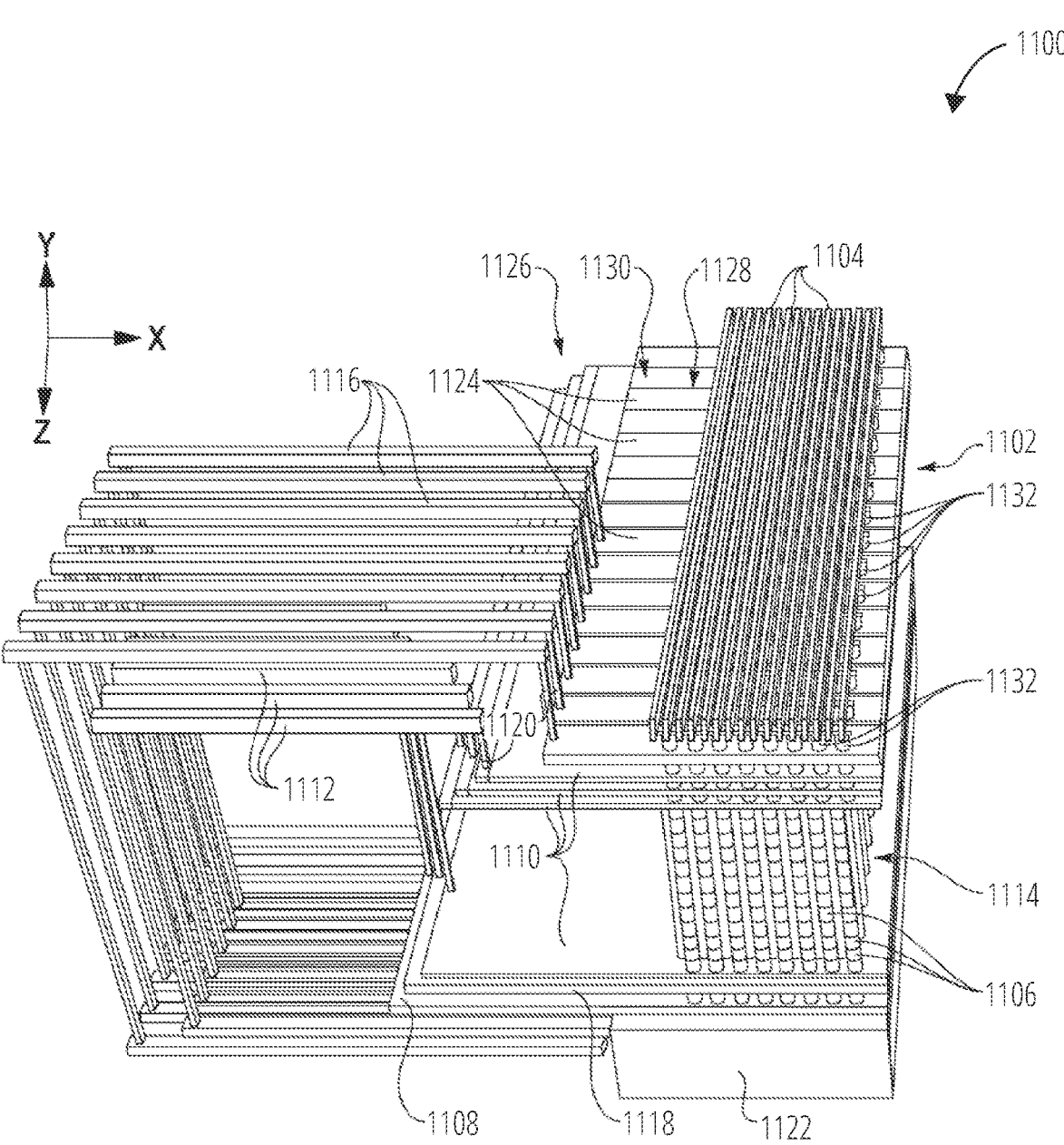
FIG. 11 illustrates a partial cutaway perspective view of a portion of a microelectronic device (e.g., a memory device, such as a dual deck 3D NAND Flash memory device) including a microelectronic device structure, according to some embodiments.

FIG. 11 illustrates a partial cutaway perspective view of a portion of a microelectronic device 1100 (e.g., a memory device, such as a dual deck 3D NAND Flash memory device) including a microelectronic device structure 1102. The microelectronic device structure 1102 may include structures substantially similar to those discussed above with reference to the memory wafer 104 of FIG. 1, the memory wafer 204 of FIG. 2, the memory wafer 300 of FIG. 3A and FIG. 3B, and the memory wafer 430 of FIG. 4. As shown in FIG. 11, the microelectronic device structure 1102 includes bitlines 1104 similar to the bitlines 114 of FIG. 1 and FIG. 2 and the bitlines 420 of FIG. 4; access line 1112; conductive contact structures 1132 similar to the conductive contact structures 318 of FIG. 3B; and a stair step structure 1126 at the wordline driver region 302 of FIG. 3A. Although not shown, isolation devices similar to the isolation devices 102, 202, 410, 500, 600, 700, 800, or 900 of FIG. 1-FIG. 9 may be provided in an isolation device region laterally offset (e.g., in a device layer) from the memory cells 1106, as illustrated for the isolation device region 308 of FIG. 3A.

The stair step structure 1126 defines contact regions for connecting the access lines 1112 to conductive structures 1110 similar to the access lines 120 of FIG. 1 and FIG. 2. The microelectronic device structure 1102 may include vertical strings 1114 of memory cells 1106 (e.g., the data storage elements 116 defined by the NAND pillars 126 of FIG. 1, the data storage elements 414 defined by the NAND pillars 416 of FIG. 4), which may be electrically connected to each other in series. The vertical strings 1114 may extend vertically (e.g., in the Z-direction) and orthogonally to conductive lines and tiers 1110, such as bitlines 1104, a source tier 1108, the conductive tiers 1110, the access lines 1112, first select gates 1124 (e.g., upper select gates, drain-side select gates (SGDs), gate electrodes of the select gate transistors 412 of FIG. 4), select lines 1116, and a second select gate 1118 (e.g., a lower select gate, a source-side select gate (SGS)). The first select gates 1124 may be horizontally divided (e.g., in the Y-direction) into multiple blocks 1130 horizontally separated (e.g., in the Y-direction) from one another by slot structures 1128.

Vertical conductive contacts 1120 may electrically connect components to each other as shown. For example, the select lines 1116 may be electrically connected to the first select gates 1124 and the access lines 1112 may be electrically connected to the conductive structures 1110. The microelectronic device 1100 may also include a control unit 1122 positioned under the memory array, which may include control logic devices configured to control various operations of other features (e.g., the vertical strings 1114 of memory cells 1106) of the microelectronic device 1100. By way of non-limiting example, the control unit 1122 may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), $V_{dd}$ regulators, drivers (e.g., string drivers), decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC) devices, self-refresh/wear leveling devices, and other chip/deck control circuitry. The control unit 1122 may be electrically connected to the bitlines 1104, the source tier 1108, the access lines 1112, the first select gates 1124, and the second select gates 1118, for example. In some embodiments, the control unit 1122 includes CMOS (complementary metal-oxide-semiconductor) circuitry. In such embodiments, the control unit 1122 may be characterized as having a "CMOS under Array" ("CuA") configuration.

The first select gates 1124 may extend horizontally in a first direction (e.g., the X-direction) and may be electrically connected to respective first groups of vertical strings 1114 of memory cells 1106 at a first end (e.g., an upper end) of the vertical strings 1114. The second select gate 1118 may be formed in a substantially planar configuration and may be electrically connected to the vertical strings 1114 at a second, opposite end (e.g., a lower end) of the vertical strings 1114 of memory cells 1106.

The bitlines 1104 may extend horizontally in a second direction (e.g., in the Y-direction) that is at an angle (e.g., perpendicular) to the first direction in which the first select gates 1124 extend. The bitlines 1104 may be electrically connected to respective second groups of the vertical strings 1114 at the first end (e.g., the upper end) of the vertical strings 1114. A first group of vertical strings 1114 electrically connected to a respective first select gate 1124 may share a particular vertical string 1114 with a second group of vertical strings 1114 electrically connected to a respective bitline 1104. Thus, a particular vertical string 1114 may be selected at an intersection of a particular first select gate 1124 and a particular bitline 1104. Accordingly, the first select gates 1124 may be used for selecting memory cells 1106 of the vertical strings 1114 of memory cells 1106.

The conductive structures 1110 may extend in respective horizontal planes. The conductive structures 1110 may be stacked vertically, such that each conductive structure 1110 is electrically connected to all of the vertical strings 1114 of memory cells 1106, and the vertical strings 1114 of the memory cells 1106 extend vertically through the stack of conductive structures 1110. The conductive structures 1110 may be vertically separated from one another by insulative material. The conductive structures 1110 may be electrically connected to or may form control gates for the memory cells 1106. Each conductive structure 1110 may be electrically connected to one memory cell 1106 of a particular vertical string 1114 of memory cells 1106.

The first select gates 1124 and the second select gates 1118 may operate to select a particular vertical string 1114 of the memory cells 1106 between a particular bitline 1104 and the source tier 1108. Thus, a particular memory cell 1106 may be selected and electrically connected to a bitline 1104 by operation of (e.g., by selecting) the appropriate first select gate 1124, second select gate 1118, and conductive tier 1110 that are electrically connected to the particular memory cell 1106.

The staircase stair step structure 1126 may be configured to provide electrical connection between the access lines 1112 and the conductive tiers 1110 through the vertical conductive contacts 1120. In other words, a particular level of the conductive tiers 1110 may be selected via an access line 1112 in electrical communication with a respective vertical conductive contact 1120 in electrical communication with the particular tier 1110.

The bitlines 1104 may be electrically connected to the vertical strings 1114 through conductive contact structures 1132 (e.g., the conductive contact structures 318 of FIG. 3B).

Figure 12:
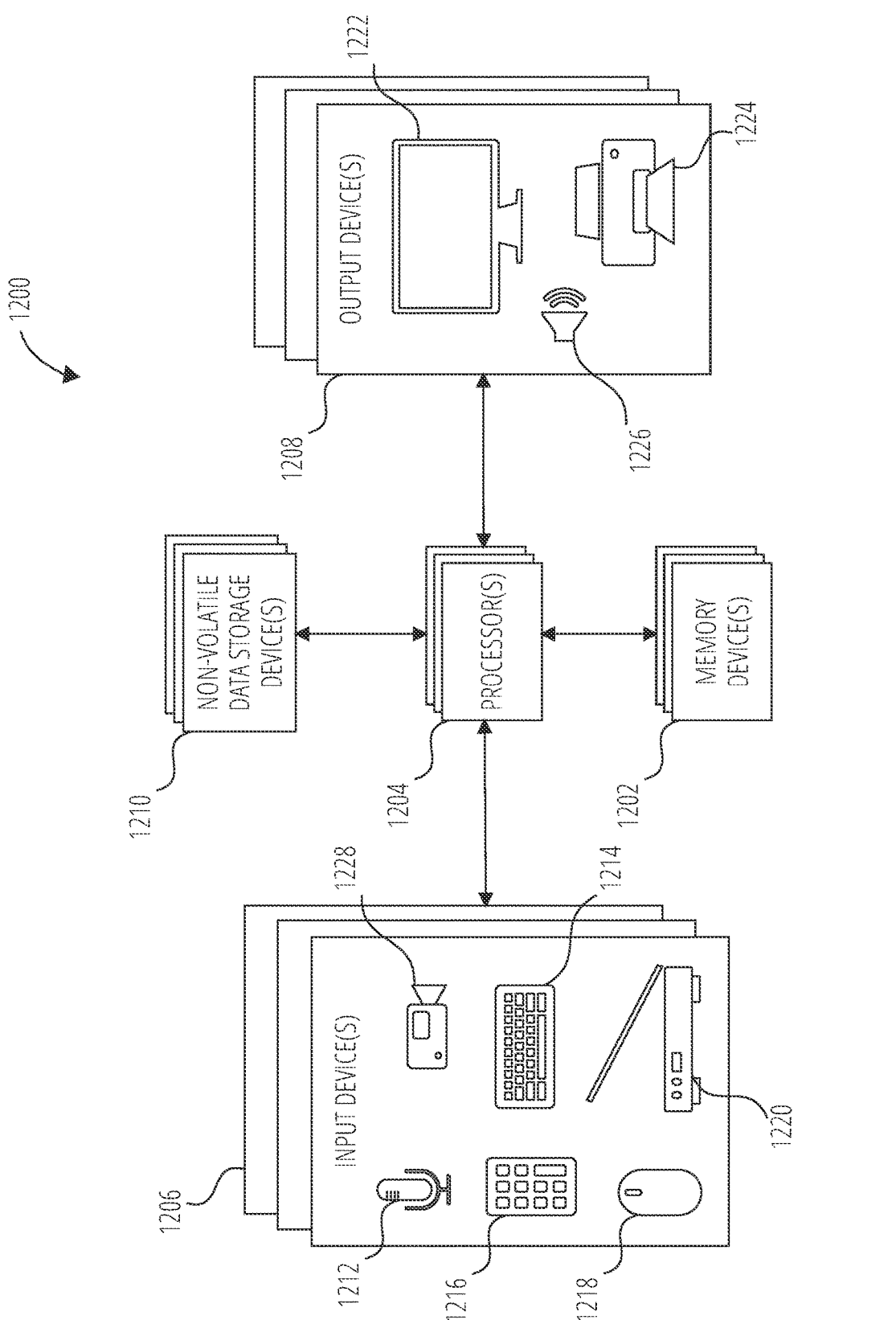
FIG. 12 is a block diagram of a computing system, according to some embodiments.

FIG. 12 is a block diagram of a computing system 1200, according to some embodiments. The computing system 1200 includes one or more processors 1204 operably coupled to one or more memory devices 1202, one or more non-volatile data storage devices 1210, one or more input devices 1206, and one or more output devices 1208. In some embodiments the computing system 1200 includes a personal computer (PC) such as a desktop computer, a laptop computer, a tablet computer, a mobile computer (e.g., a smartphone, a personal digital assistant (PDA)), a network server, or other computer device.

In some embodiments the one or more processors 1204 include a central processing unit (CPU) or other processor configured to control the computing system 1200. In some embodiments the one or more memory devices 1202 include random access memory (RAM), such as volatile data storage (e.g., dynamic RAM (DRAM) static RAM (SRAM)). In some embodiments the one or more non-volatile data storage devices 1210 include a hard drive, a solid state drive, Flash memory, erasable programmable read only memory (EPROM), other non-volatile data storage devices, or any combination thereof. In some embodiments the one or more input devices 1206 include a keyboard 1214, a pointing device 1218 (e.g., a mouse, a track pad), a microphone 1212, a keypad 1216, a scanner 1220, a camera 1228, other input devices, or any combination thereof. In some embodiments the output devices 1208 include an electronic display 1222, a speaker 1226, a printer 1224, other output devices, or any combination thereof.

The memory devices 1202 include one or more of the apparatus 100 of FIG. 1, the apparatus 200 of FIG. 2, the memory wafer 300 of FIG. 3A and FIG. 3B, the apparatus 400 of FIG. 4, the isolation devices 500 of FIG. 5, the isolation devices 600 of FIG. 6, the isolation devices 700 of FIG. 7, the isolation devices 800 of FIG. 8A, the isolation devices 900 of FIG. 9, and the microelectronic device 1100 of FIG. 11. In some embodiments the memory devices 1202 are configured to perform the method 1000 of FIG. 10.

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices) of the computing system. In some embodiments, the different components, modules, engines, and services described in the present disclosure are implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to"). Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C," or "one or more of A, B, and C," is used, in general such a construction is intended to include A alone, B alone, C alone, A and B together, A and C together, B and C together, or A, B, and C together.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the disclosure has been described herein with respect to certain illustrated embodiments, those of ordinary skill in the art will recognize and appreciate that the invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention.

What is claimed is:

1. An apparatus, comprising:
   a memory wafer including:
      an array of data storage elements, the data storage elements of the array of data storage elements configured to perform an operation responsive to an operational voltage potential applied thereto;
      bitlines electrically connected to the array of data storage elements;
      isolation devices electrically connected to the bitlines; and
      page buffer circuitry configured to electrically connect to the bitlines independent of the isolation devices; and
   a logic wafer bonded to the memory wafer, the logic wafer including logic circuitry electrically connected to the bitlines through the isolation devices, a maximum voltage potential difference tolerance of the logic circuitry less than an operational voltage potential difference between the operational voltage potential and a reference voltage potential of the logic circuitry.

2. The apparatus of claim 1, wherein the isolation devices are electrically connected to the bitlines through above array conductive material.

3. The apparatus of claim 2, wherein the isolation devices include transistors having a voltage potential difference tolerance greater than or equal to the operational voltage potential difference.

4. The apparatus of claim 2, wherein the memory wafer further comprises:

first conductive contacts electrically connecting the above array conductive material to the isolation devices; and second conductive contacts electrically connecting the isolation devices to the logic wafer.

5. The apparatus of claim 1, wherein the isolation devices are electrically connected to the bitlines through page buffer isolation devices configured to selectively isolate page buffer circuitry from the bitlines.

6. The apparatus of claim 5, wherein the isolation devices include transistors having a maximum voltage potential difference tolerance less than the operational voltage potential difference.

7. The apparatus of claim 5, wherein the isolation devices are electrically connected to the bitlines through under-array conductive material.

8. The apparatus of claim 1, wherein each of the isolation devices includes a metal-oxide-semiconductor field effect transistor (MOSFET) including:

a high voltage node at a first source/drain terminal of the MOSFET, the high voltage node electrically connected to one of the bitlines; and a low voltage node at a second source/drain terminal of the MOSFET, the low voltage node electrically connected to the logic circuitry.

9. The apparatus of claim 8, wherein a first cross-sectional area of a first contact at the first source/drain terminal is larger than a second cross-sectional area of a second contact at the second source/drain terminal.

10. The apparatus of claim 8, wherein the MOSFET further includes a gate material positioned relatively closer to the low voltage node than to the high voltage node.

11. The apparatus of claim 10, wherein the MOSFET further includes a field plate between the gate material and the high voltage node and the field plate is an extension from the gate material.

12. The apparatus of claim 10, wherein the MOSFET further includes a field plate between the gate material and the high voltage node and the field plate is separate from the gate material.

13. The apparatus of claim 10, wherein the MOSFET further includes a field plate between the gate material and the high voltage node and a thickness of a field plate oxide material between the field plate and an active material of the MOSFET is greater than 200 angstroms.

14. A method of operating a memory device, the method comprising:

electrically isolating, via an isolation device of a memory wafer, logic circuitry of a logic wafer bonded to the memory wafer from bitlines of the memory wafer, the bitlines electrically connected to data storage elements of the memory wafer, the bitlines configured to electrically connect to page buffer circuitry of the memory wafer independent of the logic wafer;

applying, while the logic circuitry is electrically isolated from the bitlines, an operational voltage potential to one or more of the data storage elements, an operational voltage potential difference between the operational voltage potential and a reference voltage potential of the logic circuitry greater than a maximum voltage potential difference tolerance of the logic circuitry;

performing, by the one or more of the data storage elements, an operation responsive to the operational voltage potential; and electrically connecting the logic circuitry to the bitlines.

15. The method of claim 14, wherein electrically isolating the logic circuitry from the bitlines comprises de-asserting a gate terminal of the isolation device electrically connected between one of the bitlines and the logic circuitry.

16. The method of claim 14, wherein electrically isolating the logic circuitry from the bitlines comprises de-asserting a gate terminal of the isolation device and a field plate extending from a gate material of the gate terminal, the isolation device electrically connected between one of the bitlines and the logic circuitry.

17. The method of claim 14, wherein electrically isolating the logic circuitry from the bitlines comprises:

de-asserting a gate terminal of the isolation device electrically connected between one of the bitlines and the logic circuitry; and asserting a field plate electrically isolated from the gate terminal between the gate terminal and a source/drain terminal of the isolation device.

18. The method of claim 14, wherein performing the operation responsive to the operational voltage potential comprises performing an erase operation.

19. An apparatus, comprising:

a high voltage wafer including:

high voltage circuitry configured to operate responsive to an operational voltage potential;

an isolation device electrically connected to the high voltage circuitry;

a conductive contact structure electrically connected to the high voltage circuitry through the isolation device; and a second, different isolation device electrically connected between the high voltage circuitry and page buffer circuitry; and a low voltage wafer bonded to the high voltage wafer, the low voltage wafer including low voltage circuitry electrically connected to the conductive contact structure, a maximum voltage potential difference tolerance of the low voltage wafer less than a high voltage potential difference between the operational voltage potential and a reference voltage potential of the low voltage wafer.

20. The apparatus of claim 19, wherein:

the high voltage wafer comprises a NAND memory wafer;

the operational voltage potential is an erase voltage potential, the erase voltage potential configured to erase data stored by data storage elements of the NAND memory wafer; and the low voltage wafer comprises a logic wafer.

\* \* \* \* \*